United States Patent [19]
McCoy, Jr.

[11] Patent Number: 5,014,160
[45] Date of Patent: May 7, 1991

[54] EMI/RFI SHIELDING METHOD AND APPARATUS

[75] Inventor: John F. McCoy, Jr., Windham, N.H.

[73] Assignee: Digital Equipment Corporation, Maynard, Mass.

[21] Appl. No.: 375,642

[22] Filed: Jul. 5, 1989

[51] Int. Cl.$^5$ ............................................. H05K 9/00
[52] U.S. Cl. ................................ 361/424; 174/35 R; 174/35 GC
[58] Field of Search .......... 174/35 R, 35 GC, 35 MS, 174/35 TS; 361/400, 424

[56] References Cited

U.S. PATENT DOCUMENTS 4,370,515  1/1983  Donaldson ........................... 361/424
4,861,941  8/1989  Kubo et al. ......................... 174/35 R

FOREIGN PATENT DOCUMENTS 3537653  4/1987  Fed. Rep. of Germany ...... 361/424
2565061  11/1985  France ............................... 174/35 R Primary Examiner—Gregory D. Thompson
Attorney, Agent, or Firm—Cesari & McKenna

[57] ABSTRACT

An apparatus is provided for EMI/RFI shielding of selected components mounted on a circuit board, the circuit board including a reference plane defined by conductive portions on the board. The circuit board also includes an arrangement of apertures in conductive relation with the reference plane. A first shield has depending members electrically engaging the apertures, while a second shield coacts electrically with either the apertures or depending members to provide encapsulation of the selected components.

21 Claims, 5 Drawing Sheets

EMI/RFI SHIELDING METHOD AND APPARATUS

BACKGROUND OF THE INVENTION

The background of the invention will be discussed in two parts.

1. Field of the Invention

This invention relates to shielding of electronic components, and more particularly, to a method and apparatus for electromagnetic interference (EMI) and radio frequency interference (RFI) shielding of components on a printed circuit board.

2. Description of the Prior Art

Shielding of electronic components for the suppression of EMI/RFI emission has been a method utilized virtually since the advent of electronic devices. Shielding of circuit components and electronic devices utilized in computers is commonplace, although with modern printed circuit board technology, the problem of shielding and the solution to shielding varies.

One approach to shielding has been to solder a half shield to the top surface of the printed circuit board, thus shielding only those components which require shielding. While this does not provide total shielding since the bottom surface of the printed circuit board to which the selected components are soldered is not enclosed, this approach has been adequate in some applications. With this method, the shield can be soldered to the printed circuit board at the same time the electronic components are soldered to the board, such as by wave soldering. The use of wave soldering as a means of affixing the shield to the board is inexpensive, but suffers some drawbacks. Since the components beneath the shield will be concealed, along with the surface area of the board thereunder, this method does not allow for cleaning, inspection and electrical test of the circuit board after wave soldering. As an alternative to allow for cleaning, inspection and test, the shield can be hand-soldered to the printed circuit board thereafter; however, this method is labor intensive and thus, expensive.

In certain critical applications, total shielding is mandated, that is the components require total shielding, above and below the printed circuit board. In such instances, shielding of the printed circuit board has been by the method of encapsulation of the entire board in a metal enclosure. Encapsulation of the entire circuit board is expensive, and in many applications, such encapsulation may not be possible or desirable due to size and weight constraints.

Therefore, in accordance with an aspect of the invention, it is a feature to provide a new and improved method and apparatus for shielding components on a selected portion of a printed circuit board.

SUMMARY OF THE INVENTION

The foregoing and other objects of the invention are accomplished by providing a printed circuit board having conductive portions thereon constituting a path defining, at least in part, a chassis ground or reference plane with apertures formed through the conductive path. In one embodiment, the apertures are plated-through elongate slots, which are preferably generally equally-spaced along the conductive ground path. Shielding is provided by an enclosure formed of first and second shield members, each having generally identical surface configurations in plan view, the first shield member being configured for insertion into the soldered side of the printed circuit board through the elongate slots, while the second shield member is configured for attachment on the component side of the printed circuit board in overlaying relation with the first shield member to form a shielding enclosure for the selected components.

The first shield member has a generally planar surface and is configured as a shallow shell-shaped, metallic five-sided half enclosure with a plurality of depending tab members configured and arranged for insertion into and through the slots. The tab members include integrally-formed, transversely projecting pairs of tangs positioned and dimensioned for frictional wiping engagement with the plated conductive layer within the slots to provide both gripping and electrical contact between the shield member and reference plane. The width of the tabs correspond to the length of the slots and the length of the tabs are dimensioned to pass through the printed circuit board and project beyond the side opposite the side of insertion. The second shield member is generally similarly configured as a metallic five-sided, deeper shell-shaped half enclosure with sidewalls, configured and dimensioned for mating detenting coaction with the tab members. For this purpose, each tab member includes an aperture with the sidewalls including mating detent projections for coaction therewith so that the second and first shield members are frictionally attached in overlaying relation to one another.

In an alternate embodiment, the apertures of the printed circuit board are preferably plated-through circular holes arranged in a pattern of fixed adjacent, electrically connected pairs surrounding the group of components requiring shielding. First and second shield members have generally identical planar surface configurations in plan view, including a plurality of depending aperture-engaging fingers. The aperture-engaging fingers that depend from both shield members are formed with an arcuate cross-section of a radius slightly greater than the radius of the through holes, thus creating a pre-loading or spring action for providing a tight frictional engagement within the holes when press-fit thereon, resulting in good electrical contact between the shield member and the plating material of the holes.

As a substitute, the apertures of the printed circuit board are simply drilled through the conductive portions of the ground path surrounding the components requiring shielding, thus eliminating the need for plating inside the apertures. The aperture-engaging fingers are then configured for edge cutting relation into the ground path portions on both sides of the circuit board for enabling electrically conductive relation between the reference plane and shield members.

In still yet another embodiment of the invention similar to the alternate embodiment, a second shield member is formed of two parts, a peripheral rail portion and a plate-like cover. The rail portion is inserted into the respective one of the pair of circular holes and wave soldered in place along with the components mounted on the printed circuit board. A first shield member is subsequently press-fit into the other respective one of the hole pairs, while the cover is attached to the rail portion thus providing a total shielding enclosure.

Other objects, features and advantages of the invention will become apparent from a reading of the specification when taken in conjunction with the drawings, in which like reference characters refer to like elements in the several views.

DESCRIPTION OF THE PREFERRED EMBODIMENTS

Figure 1:
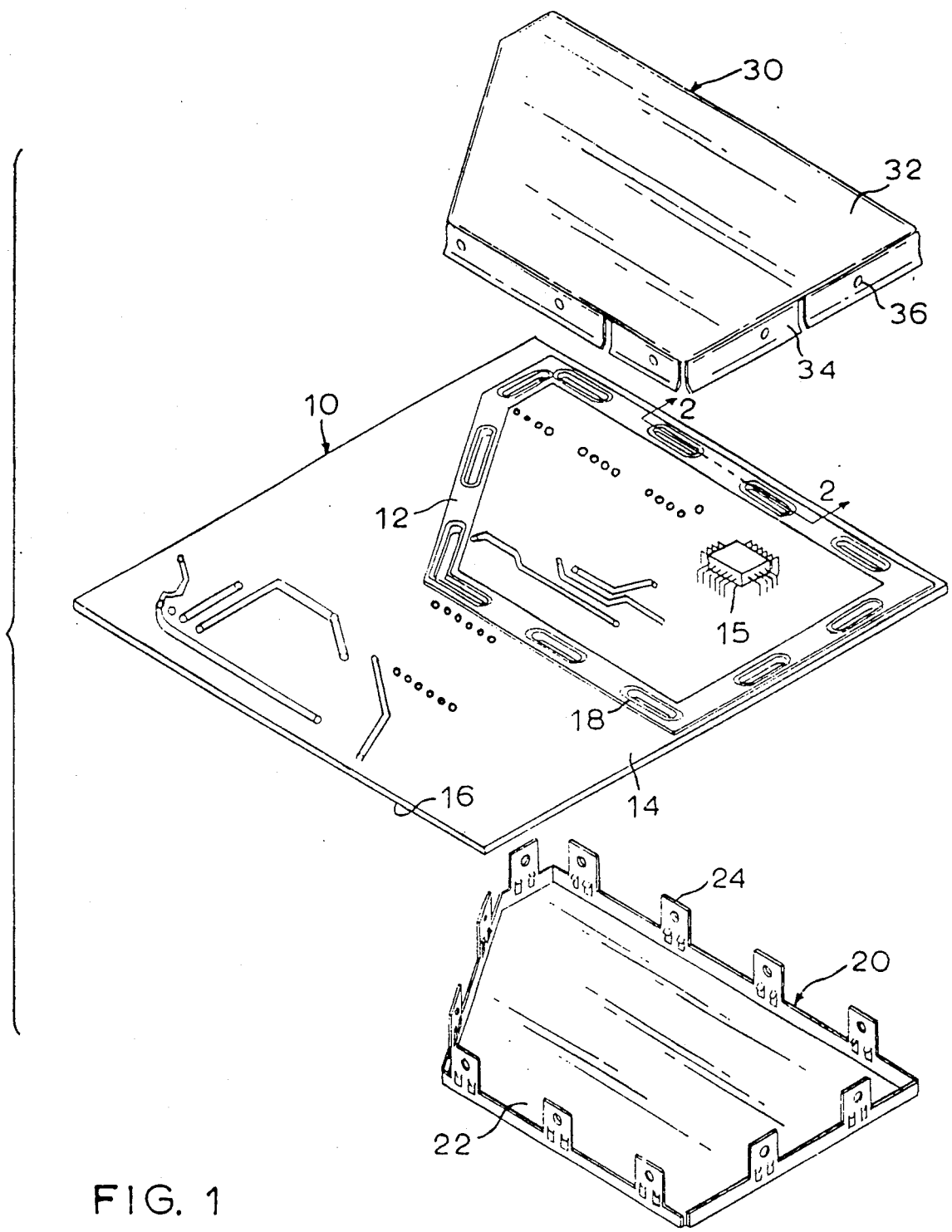
FIG. 1 is an exploded perspective view of one embodiment of the shielding apparatus according to the invention.
Figure 2:
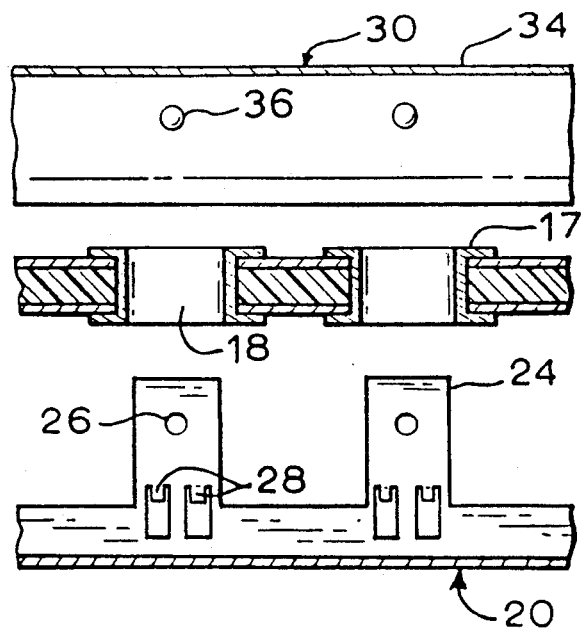
FIG. 2 is a cross-sectional view through line 2—2 of FIG. 1 illustrating plated-through slots of the FIG. 1 embodiment with portions of the first and second shield members shown in relation to the through slots.
Figure 3:
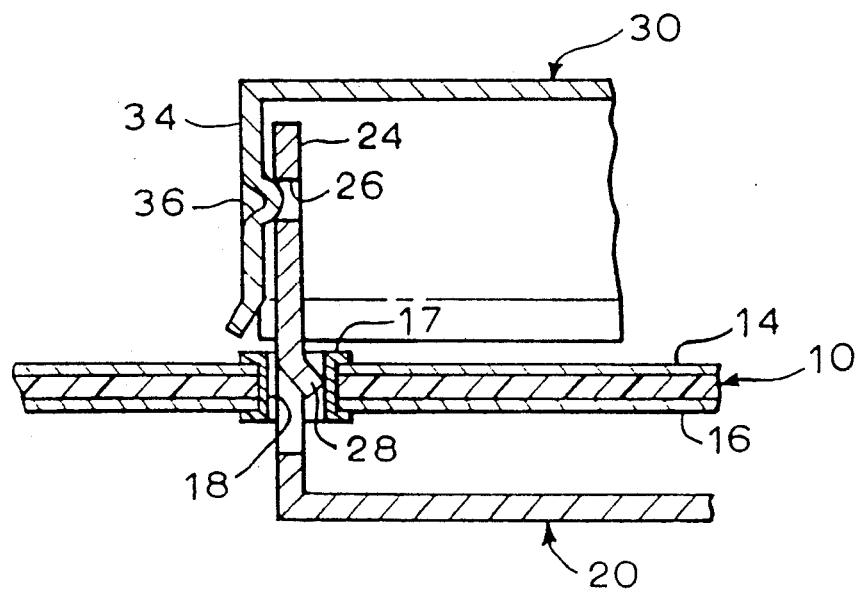
FIG. 3 is a cross-sectional view depicting the coacting detenting engagement of the shielding apparatus when attached to the printed circuit board of the embodiment of FIG. 1.

Referring to FIGS. 1-3, there is illustrated one embodiment of the invention including a circuit board, such as printed circuit board 10 and first and second shield members, designated by reference numerals 20 and 30 respectively.

Printed circuit board 10, depicted in FIG. 1, is of conventional design having conductive portions thereon constituting a path 12 defining, at least in part, a chassis ground or reference plane, which establishes a voltage reference point of zero voltage potential. Printed circuit board 10 has two sides, the first side 14 being the side upon which electronic components are normally mounted, including components 15 which require shielding. The second side 16 (not shown) of printed circuit board 10 is the side which is normally wave soldered. It will be apparent to those skilled in the art that other technologically similar circuit boards, for example circuit boards which provide for double-sided mounting of electronic components, may be used.

Printed circuit board 10 also includes a plurality of apertures formed through the conductive portions of the reference plane, such that electrical contact with the peripheral edges of the apertures on either side of circuit board 10 effectively extends the voltage reference point of zero potential. In accordance with the one embodiment of the invention, the apertures are preferably narrow, plated-through, elongate slots 18 (see also FIG. 2) and are preferably equally-spaced along a conductive ground path 12 established around electronic components 15 requiring shielding. The spacing of the slots 18 is determined in part by the frequencies and amount of attenuation required of the signals originating from the shielded portion of printed circuit board 10. The plated-through portions of slots 18 are made of suitable electrically conductive material, such as plated copper, and are in conductive relation with ground path 12, such that electrical contact with the plated-through portions of slots 18 effectively extends the voltage reference point of zero potential.

FIG. 1 depicts first shield member 20, which is made of suitable electrically conductive material, such as beryllium copper, and is preferably designed as a shallow shell-shaped, five-sided half enclosure for encapsulating a selected portion of the printed circuit board 10. Numerous similar designs for half shield members may be employed, for example rectangular shield members, without deviating from the inventive concepts described herein. The first shield member 20 has a generally planar first surface 22 and includes a plurality of integrally formed, aperture-engaging means, such as tab members 24 projecting outwardly, perpendicular to the first surface 22, the tabs 24 being systematically aligned for insertion into and through the elongate slots 18. In accordance with the one embodiment of the invention, first shield member 20 and its associated tabs 24 are configured for insertion into the soldered side 16 of printed circuit board 10.

Tab 24, as illustrated in FIG. 2, is preferably designed as an elongate, generally rectangular member with the width of tab 24 being approximately equal to or less than the width of respective slot 18, while the length of tab 24 is sufficient to pass through slot 18. Each of the tabs 24 includes an aperture 26 and a pair of integrally-formed, transversely projecting tangs 28, although various arrangements of aperture 26 and tang 28 could be used without deviating from the inventive concept of the invention. Tangs 28 are positioned on the lower half of tab 24 and are dimensioned such that when first shield member 20 is inserted into printed circuit board 10 (see FIG. 3), tangs 28 wipe and frictionally engage the conductive plating material 17 within plated-through slot 18, thereby providing electrical contact between first shield member 20 and plating material 17. Located near the center of the upper half of tab 24, which projects entirely through elongate slot 18 when inserted into circuit board 10, is aperture 26 for receiving a respective sidewall portion 34 of second shield member 30.

Referring again to FIG. 1, second shield member 30 is also made of suitable electrically conductive material, such as beryllium copper, but is preferably designed as a deeper, shell-shaped, five-sided half enclosure for encapsulating components 15 on the selected portion of printed circuit board 10 requiring shielding. Second shield member 30 has a generally planar second surface 32 with a plurality of integrally formed, sidewall portions 34 extending perpendicular to second surface 32.

FIG. 2 shows sidewall portion 34, which is preferably designed as an elongate, generally rectangular member with the width of sidewall 34 being preferably approximately equal to the width of two tabs 24 of first shield member 20. Other types and sizes of sidewalls could, of course, be used without deviating from the invention. Each of the sidewalls 34 are configured and dimensioned for mating detenting coaction with tabs 24, and as such includes mating detent projections 36 systematically arranged so as to align and engage aperture 26 of respective tab 24 (see FIG. 3) extending through board 10 when second shield member 30 is frictionally and electrically attached in overlaying relation to first shield member 20 on component side 14 of printed circuit board 10. The perimeters of the first and second shield members 20 and 30 are generally identical and the conductive path 12 of the reference plane is continuous and coextensive with that perimeter. Thus, the mating of first shield member 20 and second shield member 30 forms an electrically conductive, non-soldered shielding enclosure for the suppression of EMI/RFI emissions.

Figure 4:
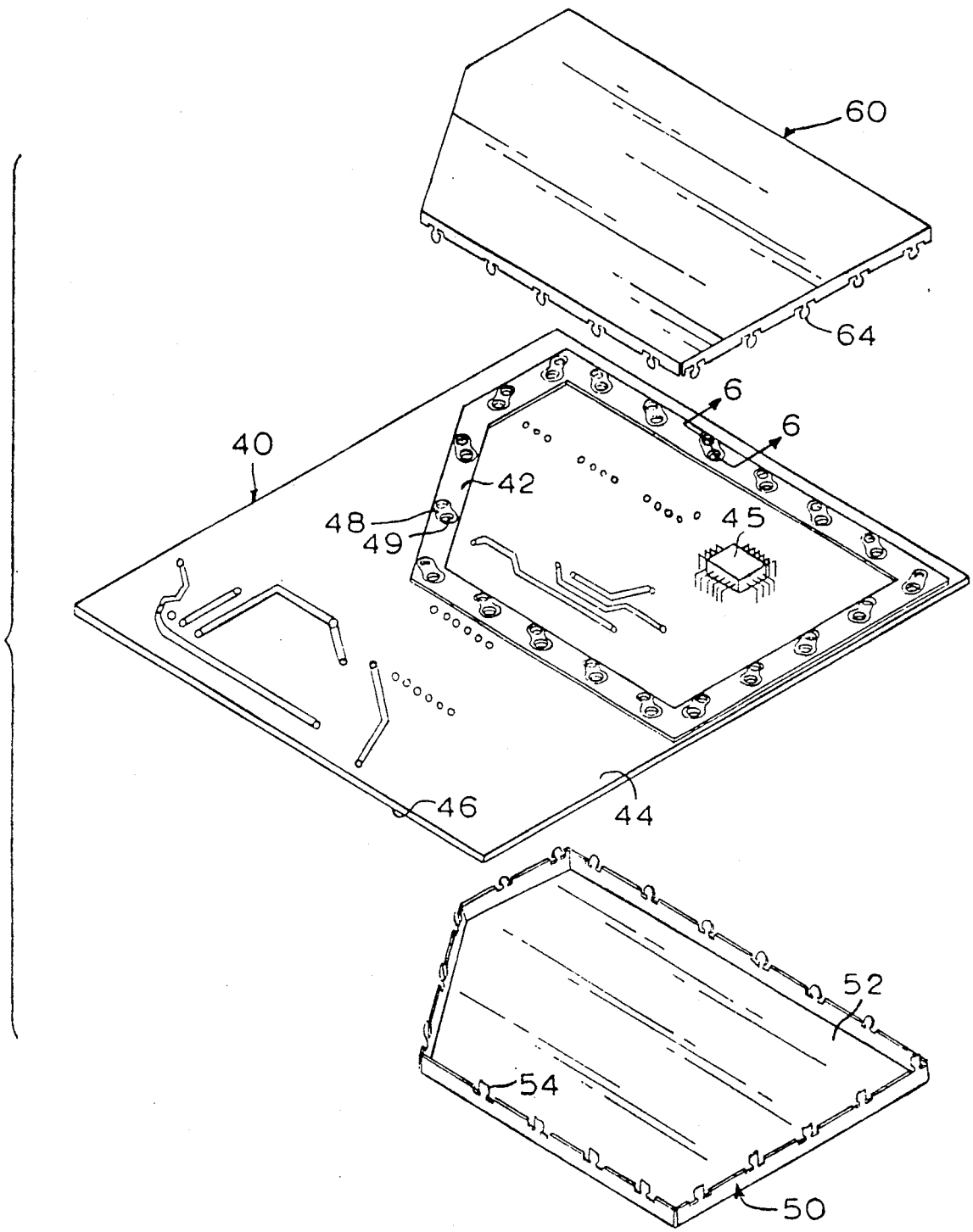
FIG. 4 is an exploded perspective view of an alternate embodiment of the shielding apparatus according to the invention.
Figure 5B:
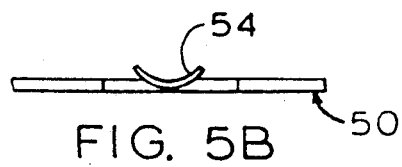
FIG. 5B is a top-down view of the finger of the shielding apparatus of the embodiment of FIG. 4.
Figure 5A:
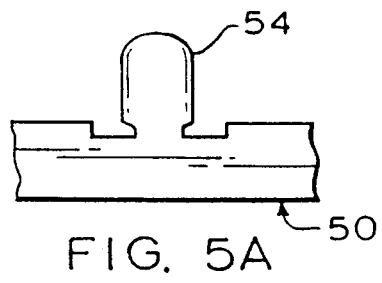
FIG. 5A is a fragmentary side view of the shape of a finger of the shielding apparatus of the embodiment of FIG. 4.
Figure 6:
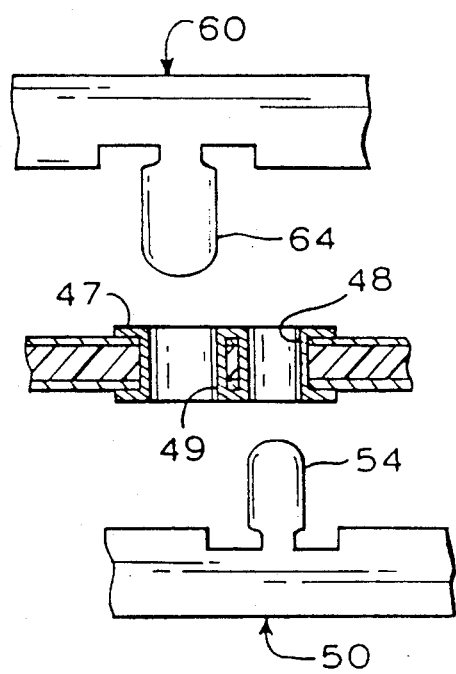
FIG. 6 is a cross-sectional view of the printed circuit board taken along line 6—6 of FIG. 4 showing portions of the shielding apparatus of the alternate embodiment in exploded relation to the through holes.

Referring to FIGS. 4–6, in an alternate embodiment of the invention the apertures of printed circuit board 40 are plated-through holes 48,49 which are circular in cross-section. As in the previous embodiment just described, plated-through holes 48,49 are in conductive relation with ground path 42 of the reference plane of printed circuit board 40 and are made of suitable electrically conductive material. For this alternate embodiment of the invention, plated-through holes 48,49 are arranged along a defined path 42 in a pattern of electrically connected, fixed adjacent hole pairs (see FIGS. 4–6), preferably equally-spaced around electronic components 45 requiring shielding. Again, spacing of the hole pairs is determined in part by the frequencies and amount of attenuation required of the signals originating from the shielded portion of circuit board 40. One of the fixed holes 48 is configured for receiving a portion of first shield member 50 while the other fixed adjacent hole 49 is configured for receiving a portion of second shield member 60, so that first shield member 50 and second shield member 60 make electrical contact via the plated-through holes 48, as opposed to an overlaying relationship.

Referring to FIG. 4, for this particular alternate embodiment, first shield member 50 is made of suitable electrically conductive material, such as stainless steel, and is preferably designed as a shallow shell-shaped, five-sided half enclosure for encapsulating a selected portion of soldered side 46 (not shown) of printed circuit board 40. Again, numerous similar designs for half shield members may be employed without deviating from the inventive concepts described herein. The first shield member 50 has a generally planar first surface 52 and includes a plurality of integrally-formed, depending aperture-engaging means, such as fingers 54.

Aperture-engaging finger 54, as illustrated in FIGS. 4, 5A, 5B and 6, is preferably formed with an arcuate cross-section of a radius slightly greater than the radius of circular hole 48. Aperture-engaging finger 54 as shown in FIGS. 4, 5A, perpendicular to first surface 52 of first shield member 50 and is systematically aligned for insertion into the respective circular hole 48 when applied to soldered side 46 of printed circuit board 40. Since the depending finger 54 has a slightly greater radius than the radius of circular hole 48 as depicted in FIG. 6, a tight frictional engagement similar to a preloading or spring-like action is provided when the finger 54 is press-fit into the hole 48, thereby providing rigid, electrical contact between first shield member 50 and the plating material 47 in hole 48.

Second shield member 60, shown in FIG. 4, is made of suitable electrically conductive material, such as stainless steel, and is preferably designed as a deeper, shell-shaped, five-sided half enclosure for encapsulating the selected components 45 on the portion of printed circuit board 40 requiring shielding. Second shield member 60 has a generally identical surface configuration to that of first shield member 50, including a plurality of integrally formed, depending aperture-engaging fingers 64, again preferably identical to the shape of fingers 54 of first shield member 50. As such, the depending aperture-engaging fingers 64, illustrated in FIG. 6, are preferably formed with an arcuate cross-section of a radius having a slightly greater radius than the radius of respective circular, plated-through holes 49 and therefore are configured and dimensioned for tight frictional and electrical coacting engagement with holes 49 when press-fit on component side 44 of printed circuit board 40. Thus, the press-fitting of first shield member 50 and second shield member 60 into the electrically connected pair of plated-through holes 48,49 forms another electrically conductive, non-soldered shielding enclosure for the suppression of EMI/RFI emissions.

Figure 7:
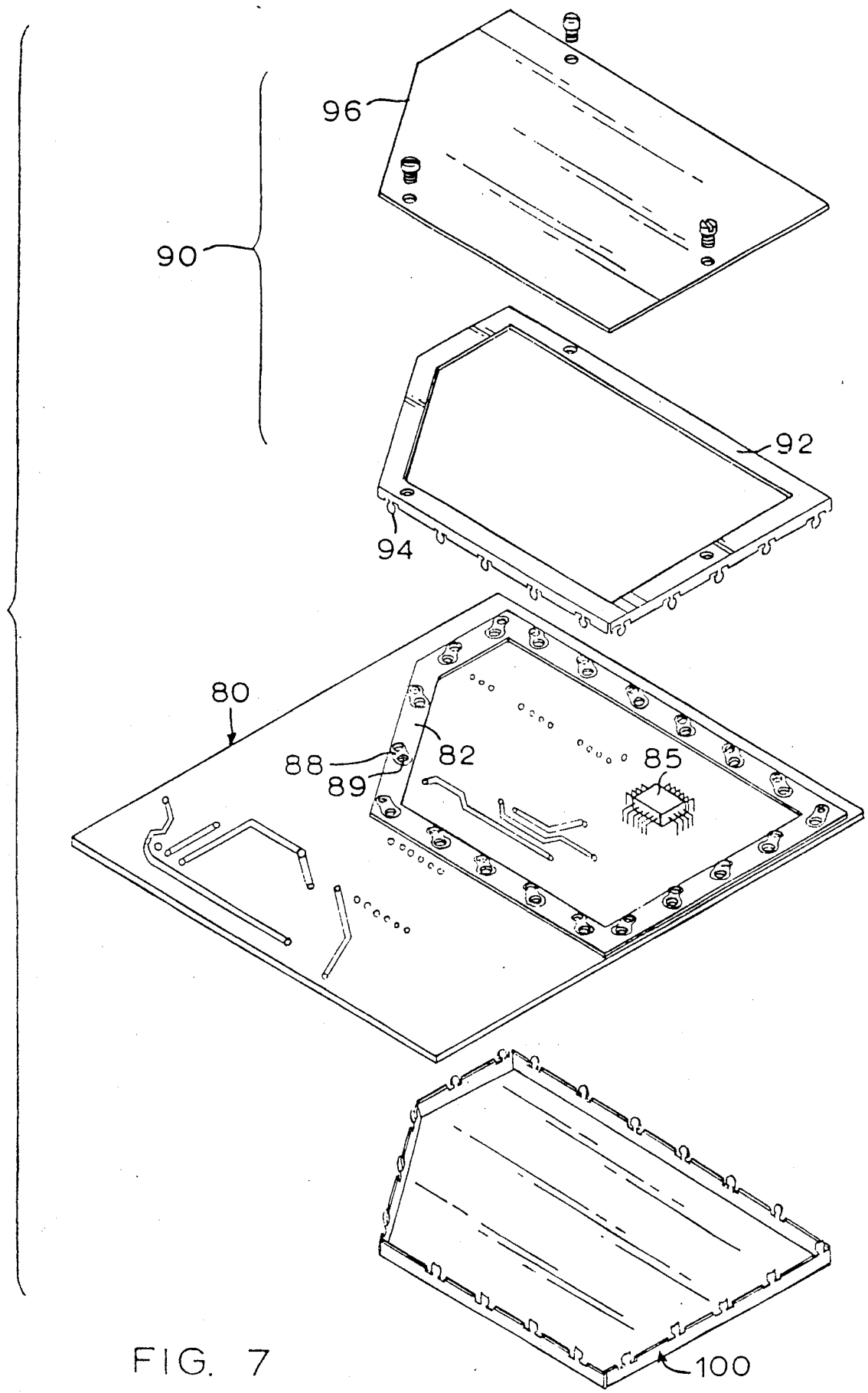
FIG. 7 is an exploded view of another embodiment similar to the alternate embodiment of the shielding apparatus according to the invention.

FIG. 7 is an exploded view of another embodiment similar to the alternate embodiment of the shielding apparatus according to the invention. The apertures of printed circuit board 80 are identical to the apertures of printed circuit board 40, and as such, are arranged as plated-through, electrically connected, circular hole pairs 88,89 in conductive relation with ground path 82 of the reference plane, and are preferably equally-spaced along conductive path 82 around electronic components 85 requiring shielding. One set of fixed holes 89 is configured for receiving a portion of second shield member 90, while the other set of fixed adjacent holes 88 is configured for receiving a portion of first shield member 100, so that second shield member 90 and first shield member 100 make electrical contact via plated-through holes 88,89.

Second shield member 90 is formed of two parts, a peripheral frame or rail portion 92 and a plate-like cover 96. Rail 92 is generally L-shaped in cross-section and preferably formed as an elongate, five-sided, fence-like member made suitable electrically conductive material, such as tin-plated steel. Rail 92 has a plurality of integrally formed, depending aperture-engaging fingers 94 (somewhat identical to fingers 54 and 64 respectively of the alternate embodiment) for insertion into plated-through holes 89. For this embodiment, however, aperture-engaging fingers 94 preferably have a slightly smaller radius than the radius of circular holes 89 so that fingers 94 are easily inserted into holes 89 and subsequently wave soldered in place along with the electronic components mounted on board 80.

Cover 96 is preferably a flat, generally planar, electrically conductive member of like stainless steel which is attached to rail 92 by any suitable means, such as metal screws. The first shield member 100, preferably similar in design to first shield member 50, is press-fit into the other holes 88, thereby providing a total shielding enclosure for components 85.

Figure 8:
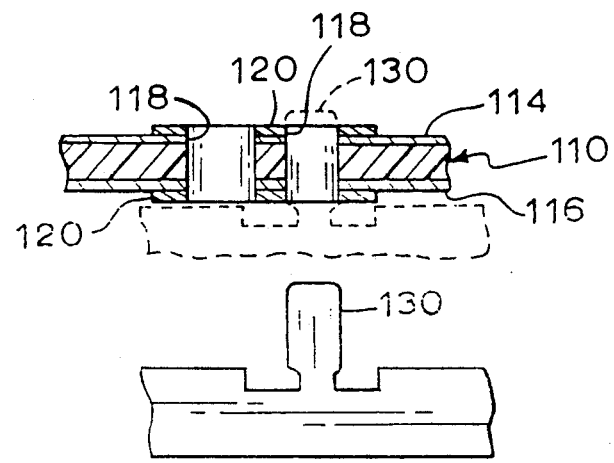
FIG. 8 depicts a sectional view of an alternate shield attachment method utilizing non-plated through holes with fingers configured for cutting into conductive pads disposed on both sides of a printed circuit board around the edges of the holes.

FIG. 8 depicts an alternate shield attachment method in which the apertures, such as circular holes 118 are simply drilled, not plated, through printed circuit board 110. First side 114 and second side 116 of board 110 include conductive pads 120 disposed about the perimeter of holes 118, the pads 120 being in conductive relation, and thus part of the reference plane. Fingers 130 are depicted with the configuration thereof formed to effect a cutting action, that is the width of fingers 130 is slightly greater than the diameter of holes 118, so that upon press-fitting, the lateral edges of fingers 130 (as shown in broken lines) effectively cut into conductive pads 120 at the perimeter of holes 118. This provides electrical connection between fingers 130 and the reference plane, while also electrically interconnecting conductive pads 120 on first side 114 and second side 116 of circuit board 110.

The embodiments herein described enable the application and use of a shielding apparatus for electronic components mounted on a printed circuit board after the printed circuit board has been wave soldered, thereby allowing for the cleaning, inspection, test and repair of assembled electronic components in an inexpensive manner.

It will therefore be apparent to those skilled in the art that various changes and modifications in the specifically described embodiments can be carried out without departing from the scope of the invention which is intended to be limited only by the scope of the appended claims.

What is claimed is:

1. Apparatus for providing EMI/RFI shielding of selected electronic components mounted on a circuit board, said apparatus comprising:
   a reference plane of said circuit board, said reference plane defined by conductive portions on said board;
   a plurality of plated-through elongate slots formed through said conductive portions in conductive relation with said reference plane and arranged to define a path surrounding the selected components;
   a shallow, shell-shaped half enclosure made of electrically conductive material having a plurality of tabs with at least one tang configured, dimensioned and arranged for electrically conductive engagement with respective ones of said plated-through slots; and
   second shield means co-acting frictionally and electrically with said plated-through slots, thereby providing encapsulation of the selected components.

2. Apparatus for providing EMI/RFI shielding as recited in claim 1 wherein said second shield means includes a plurality of sidewalls having mating detent projections, said detent projections of said sidewalls aligned and configured for engaging respective ones of said tabs.

3. Apparatus for providing EMI/RFI shielding as recited in claim 2 wherein said second shield means is an enclosure made of electrically conductive material.

4. Apparatus for providing EMI/RFI shielding as recited in claim 3 wherein said tabs further include an aperture for frictionally and electrically engaging said mating detent projections.

5. Apparatus for providing EMI/RFI shielding as recited in claim 4 wherein said reference plane establishes a voltage reference point of zero voltage potential within said circuit board.

6. Apparatus for EMI/RFI non-soldered shielding of electronic components mounted on a printed circuit board, the printed circuit board including a reference plane and having a plurality of plated-through elongate slots in electrically conductive relation to the reference plane, said apparatus comprising:
   a first shield member having a plurality of depending elongate, generally rectangular tab members arranged and aligned for insertion into and through respective ones of said slots, said tab members including at least one tang for electrical contact with said plated-through portions of said respective slots; and
   a second shield member having a plurality of sidewalls, said sidewalls aligned and configured for frictionally and electrically engaging said tab members.

7. Apparatus for EMI/RFI non-soldered shielding as recited in claim 6 wherein said sidewalls include mating detent projections.

8. Apparatus for EMI/RFI non-soldered shielding as recited in claim 7 wherein said tab members further include an aperture for engagement with said mating detent projections when said second shield member is frictionally attached in overlaying relation to said first shield member.

9. Apparatus for EMI/RFI non-soldered shielding as recited in claim 8, wherein said first shield member is a shallow, shell-shaped, five-sided half enclosure made of electrically conductive material.

10. Apparatus for EMI/RFI non-soldered shielding as recited in claim 9, wherein said second shield member is a deep, shell-shaped, five-sided half enclosure made of electrically conductive material.

11. Apparatus for EMI/RFI non-soldered shielding as recited in claim 10 wherein said first and second shield members are made of beryllium copper.

12. Shielding apparatus for providing EMI/RFI shielding of electronic components mounted on a printed circuit board having a component side for mounting at least one electronic component thereon and a soldered side, said board further including a reference plane and having a plurality of plated-through elongate slots in conductive relation to said reference plane, said shielding apparatus comprising:
   a first electrically conductive shield member, said first shield member having a generally planar first surface and including a plurality of tabs, said tabs projecting outwardly perpendicular to said first surface and aligned for insertion into and through respective ones of said slots when applied to said soldered side of said board, said tabs including at least one tang for wiping said plated-through slots, thereby providing electrical contact between said first shield member and said reference plane; and
   a second electrically conductive shield member, said second member arranged in a deep, shell-shaped configuration having a generally planar second surface with a plurality of integrally formed, generally rectangular sidewalls extending perpendicular to said second surface, said sidewalls configured for frictional and electrical engagement with said tabs when mated on said component side of said board.

13. Shielding apparatus for providing EMI/RFI shielding as recited in claim 12 wherein said tabs further include an aperture.

14. Shielding apparatus for providing EMI/RFI shielding as recited in claim 13 wherein said sidewalls include a mating detent projection for alignment and engagement with said aperture of said tabs when said second shield member is attached in overlaying relation to said first shield member.

15. Apparatus for providing EMI/RFI shielding of selected electronic components mounted on a circuit board, said apparatus comprising:
   a reference plane of said circuit board, said reference plane defined by conductive portions on said board;
   a plurality of plated-through circular holes formed through said conductive portions in conductive relation with said reference plane and arranged to define a path surrounding the selected components;

first shield means having a plurality of fingers formed with an arcuate cross-section of a radius slightly greater than the radius of said circular holes, said fingers configured, dimensioned and arranged for electrically conductive engagement with respective ones of said plated-through holes; and second shield means co-acting frictionally and electrically with said fingers, thereby providing encapsulation of the selected components.

16. Apparatus for providing EMI/RFI shielding as recited in claim 15 wherein said first shield means is a shallow, shell-shaped half enclosure made of electrically conductive material.

17. Apparatus for providing EMI/RFI shielding as recited in claim 16 wherein said reference plane establishes a voltage reference point of zero voltage potential within said circuit board.

18. Apparatus for providing EMI/RFI shielding as recited in claim 16 wherein said second shield means is an enclosure made of electrically conductive material.

19. Apparatus for EMI/RFI non-soldered shielding of electronic components mounted on a printed circuit board, the printed circuit board including a reference plane and having a plurality of circular holes having plated-through portions, said holes electrically connected and arranged in pairs in electrically conductive relation to said reference plane, said apparatus comprising:

a first shield member having a plurality of integrally-formed, depending aperture-engaging fingers formed with an arcuate cross-section of a radius slightly greater than the radius of said circular holes arranged, configured and dimensioned for insertion into respective ones of said holes of each of said pairs of holes, said fingers configured for electrical contact with said plated-through portions of said holes; and a second shield member having a plurality of integrally-formed, depending aperture-engaging fingers formed with an arcuate cross-section of a radius slightly greater than the radius of said circular holes arranged, configured and dimensioned for insertion into the other of said respective ones of said holes of each of said pairs of holes, said fingers configured for electrical contact with said plated-through portions of said holes, whereby said first shield member and said second member make electrical contact via said plated-through portions of said holes.

20. Apparatus for EMI/RFI non-soldered shielding as recited in claim 19 wherein said first shield member is a shallow, shell-shaped, five-sided half enclosure made of electrically conductive material.

21. Apparatus for EMI/RFI non-soldered shielding as recited in claim 20 wherein said second shell member includes a cover attached to a rail portion.

* * * * *